United States Patent [19]

Burward-Hoy

[11] Patent Number: 5,441,102
[45] Date of Patent: Aug. 15, 1995

[54] HEAT EXCHANGER FOR ELECTRONIC EQUIPMENT

[75] Inventor: Trevor Burward-Hoy, Cupertino, Calif.

[73] Assignee: Sun Microsystems, Inc., Mountain View, Calif.

[21] Appl. No.: 186,989

[22] Filed: Jan. 26, 1994

[51] Int. Cl.$^6$ ............................................. F28D 15/02
[52] U.S. Cl. .................... 165/104.25; 165/104.33; 165/104.22; 257/715; 361/700
[58] Field of Search ............... 165/80.4, 80.5, 104.21, 165/104.22, 122, 104.28, 104.33, 104.25; 62/3.1, 3.2, 3.3; 366/147; 361/699, 700, 702, 703, 710; 257/713, 714, 715

[56] References Cited

U.S. PATENT DOCUMENTS

| | | | |
|---|---|---|---|
| 5,287,249 | 2/1994 | Chen | 165/80.3 X |
| 5,297,617 | 3/1994 | Herbert | 165/80.3 |
| 5,299,632 | 4/1994 | Lee | 165/80.3 |
| 5,309,983 | 5/1994 | Bailey | 165/80.3 |

Primary Examiner—John Rivell
Assistant Examiner—Christopher Atkinson
Attorney, Agent, or Firm—Blakely Sokoloff Taylor & Zafman

[57] ABSTRACT

A heat transfer apparatus is disclosed. The heat transfer apparatus includes a heat pipe containing heat transfer liquid. Disposed in the heat pipe is a centrifugal rotor assembly having fixed magnets on the rotor blades. A magnetic field is generated by a magnetic coil assembly that surrounds the heat pipe. The rotor assembly rotates in response to the magnetic field, agitating the heat transfer liquid. A second embodiment is a liquid heat transfer system that includes a heat absorption chamber, a pump, and a heat exchanger where circulation and cooling of the heat transfer liquid occurs outside of the heat absorption chamber.

10 Claims, 11 Drawing Sheets

HEAT EXCHANGER FOR ELECTRONIC EQUIPMENT

BACKGROUND OF THE INVENTION

1. Field of the Invention

The present invention relates generally to the field of heat transfer devices and more particularly to an apparatus and method for the transfer of heat from the surface of a semiconductor chip package.

2. Art Background

Integrated circuits (ICs) dissipate power during operation, generating heat. To avoid device failure, this heat must be transferred away from the IC at a sufficient rate such that the temperature of the die remains within operating parameters. Modern manufacturing processes allow a more dense population of transistors in the same die space than previously available, leading to ICs that dissipate more heat and require more cooling.

Prior art solutions to cooling ICs are typically inefficient, but they are sufficient for cooling low power devices. As the power dissipation of the IC increases, the inefficiencies of the prior art cooling systems are magnified. Nonetheless, if there were no other considerations in computer system design, the prior art cooling systems could be adapted to provide an adequate solution. However, ICs that are components in a computer system are typically contained within an enclosure that is a compromise of several important goals.

The most important goal of computer enclosure design is to provide adequate cooling to the components. Typically, the ICs are cooled by combining conduction and convection techniques for heat transfer. For example, a heat spreader type of heat sink manufactured of a highly heat conductive material will be coupled to the IC package. Heat is transferred from the smaller surface area of the die to the larger surface area of the heat sink. This is an example of conduction. A fan blows air across the surfaces of the heat sink. Heat is transferred to the air mass, which continues to move away from the heat sink. This is an example of convection or mass transport.

Other goals of enclosure design include minimizing the size of the enclosure and minimizing the acoustic signature of the system. When high power ICs are used by the system, at least one of these goals most likely will be sacrificed if the typical prior art cooling solutions are to used. One method for providing sufficient cooling using prior art techniques is to increase the mass flow of air across the heat sinks. Unfortunately, this requires either installing a larger fan or increasing the operating voltage of the fan that is already installed. Neither of these solutions is desirable because installing a larger fan increases the size of the enclosure and increasing the operating voltage of the fan increases the acoustic signature of the computer system.

If the size and operating voltage of the fan are to remain unchanged when high power ICs are used, the inefficiencies of the prior art heat transfer systems must be addressed. First, the heat spreader/heat sinks of the prior art do not exhibit isothermal behavior across the entire surface of the heat sink. This is because there are some thermal losses in the conductive material of the heat sink. The temperature gradient created by these thermal losses results in thermal overhead that requires greater mass flow of air across the heat sink. Second, the heat capacity of air is quite low. Therefore, a heat transfer medium other than air is preferred.

Accordingly, as will be described, a first embodiment of the present invention is an apparatus that uses a heat pipe having minimal thermal overhead and approximately isothermal behavior as a heat sink. A second embodiment of the present invention is a heat transfer system using a circulating heat transfer liquid. As will be shown, the method and apparatus of the present invention provide sufficient cooling for high power ICs with a minimum impact on the goals of minimizing enclosure size and minimizing the acoustic signature of the system.

SUMMARY OF THE INVENTION

In a first embodiment of the present invention there is disclosed a heat transfer apparatus that includes a heat pipe surrounded by a magnetic coil. Disposed in the heat pipe is a centrifugal rotor assembly having fixed magnets coupled to the rotor blades. When power is applied to the magnetic coil, the rotor assembly rotates, agitating the heat transfer liquid that is contained in the heat pipe. Further, the heat pipe may be evacuated to a reduced pressure so that is acts on the manner of a Perkins boiler, providing further agitation of the heat transfer liquid.

The second embodiment of the present invention discloses a heat transfer system that includes a heat absorption chamber, a pump, and a heat exchanger. Heat transfer liquid is introduced into the heat absorption chamber via an inlet pipe. The heat transfer liquid flows into the inner chamber, over a perforated plate, and onto the bottom heat conducting plate of the outer chamber. Heat on the bottom heat conducting plate is transferred to the heat transfer liquid, which is circulated in the heat absorption chamber and out of the outlet pipe by the pump, which delivers the heated heat transfer liquid to the heat exchanger. One implementation of the second embodiment uses a fin type heat exchanger. A second implementation employs a ring-type heat exchanger.

Other embodiments, features, and advantages will be apparent from the accompanying drawings and from the detailed description which follows.

BRIEF DESCRIPTION OF THE DRAWINGS

FIG. 4 is a cross sectional side view of the heat transfer apparatus shown in FIG. 1.

DETAILED DESCRIPTION OF THE DISCLOSURE

The disclosed method and apparatus incorporate the use of thermally conductive liquids to provide the more efficient transfer of thermal energy in computer systems. A first illustrative embodiment includes a heat pipe having an agitator for agitating a heat transfer liquid that is disposed in the heat pipe. The agitator is preferably driven by a magnetic coil assembly-that generates a magnetic field when power is supplied. A second illustrative embodiment includes a chamber that contains a thermally conductive liquid. Cool liquid is introduced into the chamber through the use of a pump, which also removes heated liquid from the chamber for cooling.

In the following description numerous specific details are set forth such as dimensions, materials, thicknesses, structure, etc., in order to provide a thorough understanding of the present invention. However, it will be obvious to one skilled in the art that the invention may be practiced without these specific details. In other instances, well-known processing techniques, materials, etc. have not been shown in detail in order to avoid unnecessarily obscuring the present invention.

Figure 1:
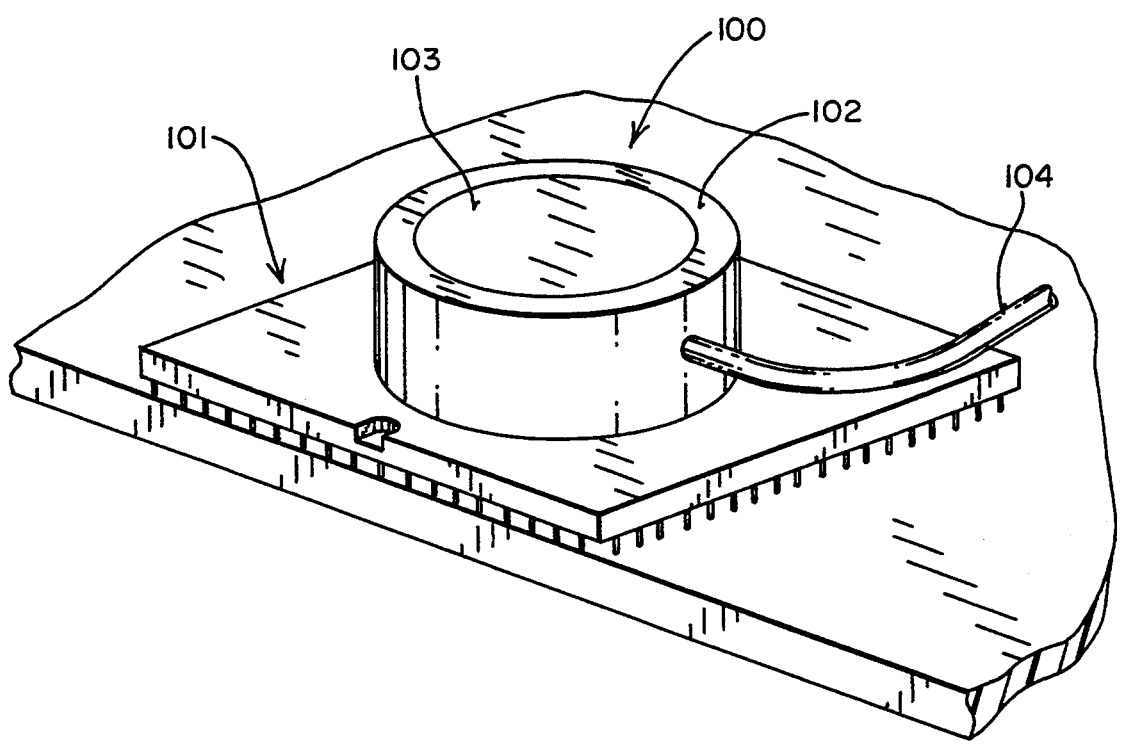
FIG. 1 is a perspective view of a first embodiment illustrating a heat transfer apparatus in contact with an IC package.

FIG. 1 is a perspective view of a first illustrative embodiment of the invention in which a heat transfer apparatus 100 is coupled to an IC package 101. The heat transfer apparatus 100 includes a heat pipe 103 disposed within a magnetic coil assembly 102. When power is supplied to the coil assembly 102 via cable 104, a magnetic field is generated. The magnetic field permeates the heat pipe 103 and reacts with the fixed magnets of a rotor assembly (not shown), causing the agitation of the heat transfer liquid in the heat pipe 103.

Figure 2:
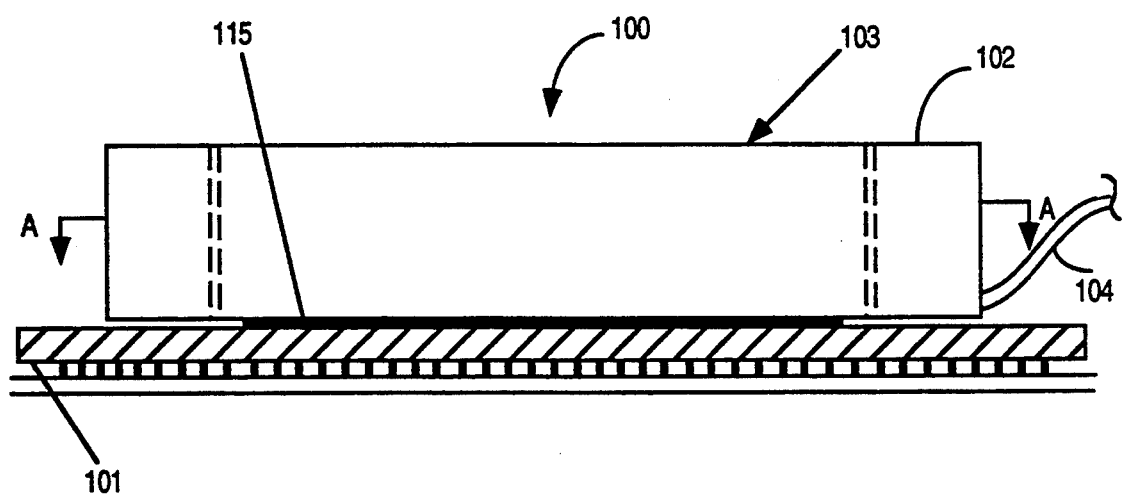
FIG. 2 is a side view of the heat transfer apparatus shown in FIG. 1.

FIG. 2 is a side view of the first illustrative embodiment along the A—A axis. There is shown a heat spreader 115 manufactured of copper that is an integral part of the top surface of the IC package 101. The bottom surface of the heat pipe 103 is preferably placed in direct contact with the heat spreader 115. If the top surface of the IC package 101 includes a heat spreader 115, the size of the bottom surface of the heat pipe 103 can be limited to the size of the heat spreader 115. If no heat spreader is provided, the size of the bottom surface is preferably sufficient to cover the entire IC package 101. During operation, the IC generates heat that is transferred from the top surface of the IC package 101 to the bottom surface of the heat pipe 103 via conduction. In order to maximize heat transfer between the IC package 101 and the heat pipe 103, a high efficiency thermal interface between the two is desired.

Figure 3:
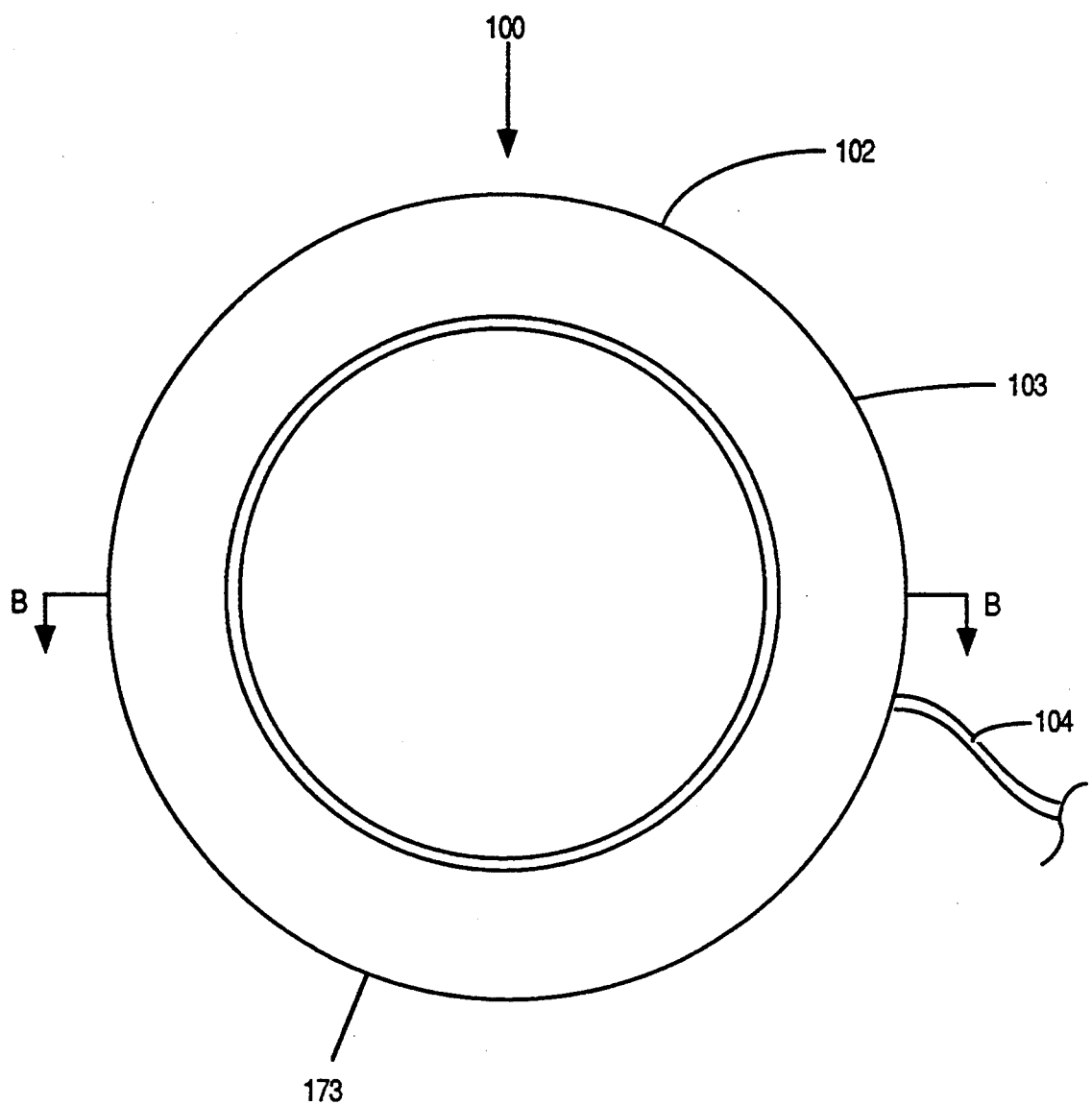
FIG. 3 is a top view of the heat transfer apparatus shown in FIG. 1.

FIG. 3 illustrates a top view of the heat transfer apparatus 101 that clearly illustrates the magnetic coil assembly 102, heat pipe 103 and the cable 104. As is well known in the prior art, the heat pipe 103 is a sealed chamber containing a thermally conductive heat transfer liquid of high heat capacity,. The heat transfer liquid can be any high heat capacity fluid. For example, water, ethanol, ethanol/water mixture, and alumina loaded slurries can be used. The shape of the heat pipe 103 is preferably cylindrical, and all of the surfaces of the heat pipe 103 are preferably manufactured of copper or some other thermally conductive material. The walls of the heat pipe 103 are preferably as thin as possible in order to minimize thermal conduction losses.

Within the heat pipe 103 there is preferably placed a magnetic rotor assembly (not shown) having fixed magnets coupled to the rotor blades. The chamber is preferably only 95% filled with liquid and is preferably evacuated to a reduced pressure such that the thermally conductive liquid will boil approximately at the operating temperature of IC. The combination of the manual agitation provided by the rotating rotor assembly and the natural agitation of the boiling action ensure constant circulation of the liquid within the heat pipe 103. Because the liquid is continuously circulated, there is no need for a wick or a capillary material. It will be understood by one of ordinary skill in the art that the use of an agitator alone is sufficient to ensure adequate circulation.

The heat is conducted through the bottom wall of the heat pipe 103 to the inner surface, where it is transferred to the circulating liquid. Micromachine grooves can be etched in the bottom inner surface of the heat pipe 103 to maximize the heat transfer surface area presented to the heat transfer liquid. The heat exchange between the copper surface and the liquid is very efficient, leading to minimal thermal losses. The circulating motion of the liquid carries the heated liquid to the inner surface of the top wall of the heat pipe 103, where the heat is transferred from the liquid to the copper wall. If the liquid were not circulated, the heat would be conducted through the liquid and the walls of the chamber until it reached the outer surfaces of the heat pipe 103, resulting in thermal losses. These thermal losses are minimized by circulating the liquid. The heat is delivered evenly to the inner surface of the top wall, where it is conducted to the top surface of the heat pipe 103. The heat pipe thus exhibits approximately isothermal behavior on its top surface while minimizing the temperature gradient associated with conductive thermal losses.

Figure 4:
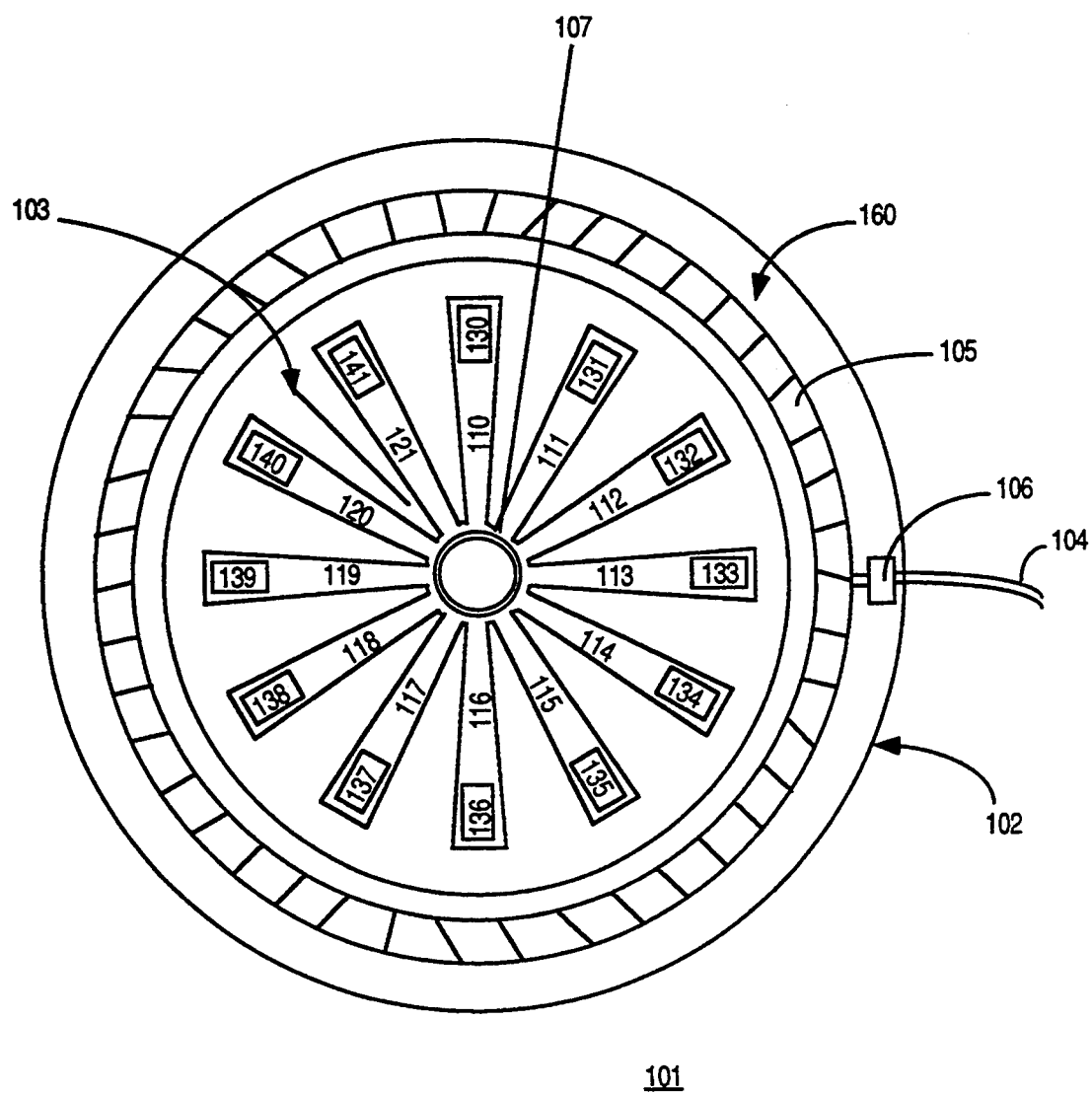
FIG. 4 is a cross sectional top view of the heat transfer apparatus shown in FIG. 1.

FIG. 4 illustrates a cross sectional view of the heat transfer apparatus shown in FIG. 1 along axis B—B. It can be seen that the magnetic coil assembly 102 is composed of an outer frame 160 and processing circuit 106 which is directly coupled to the power supply cable 104. The processing circuit 106 is directly coupled and provides power to the magnetic coil assembly 102. Once power is provided to the magnetic coil assembly 102 from the processing circuit 106, a magnetic field is created which extends into the sealed chamber of the heat pipe 103. The processing circuit 106 may contain, for example, a breaker switch, a heat detection system, and any of a number of other devices or sensors. Additionally, the power supply cable 104 may be supplied with data and control lines to allow the computer system to communicate with and control the processing circuit 106. This allows for computer shutdown in the event that an excessive temperature is detected by the processing circuit 106.

Disposed within the heat pipe 103 is centrifugal rotor assembly 107 which has a circular opening at its center of sufficient size to allow free movement of the heat transfer liquid. The centrifugal rotor assembly 107 can be made from any of a number of materials; however, it is preferable to use a plastic material in order to minimize the friction between the centrifugal rotor 107 and the interior surfaces of the heat pipe 103. No retainer ring is required to hold the centrifugal rotor assembly 107 in place because the motion of the rotor creates a vortex around which the centrifugal rotor assembly 107 rotates.

The centrifugal rotor assembly 107 includes a number of rotor blades for circulating heat transfer liquid within the heat pipe 103. Magnetic elements 130-141 are disposed at or near the ends of each of the rotor blades. Upon the application of power to the magnetic coil 105, the magnetic field produced by the magnetic coil 105 interacts with each of the magnetic elements 130-141 so as to cause the centrifugal rotor assembly 107 to rotate. Though as few as 4 to 6 blades could be used to circulate fluid, it is preferable to use 12-14 blades in order to give a uniform drive, which allows for uniform wear of the components. Furthermore, the use of 12-14 blades maximizes the amount of force generated by the interaction between the magnetic field and the magnetic elements 130-141.

Figure 5:
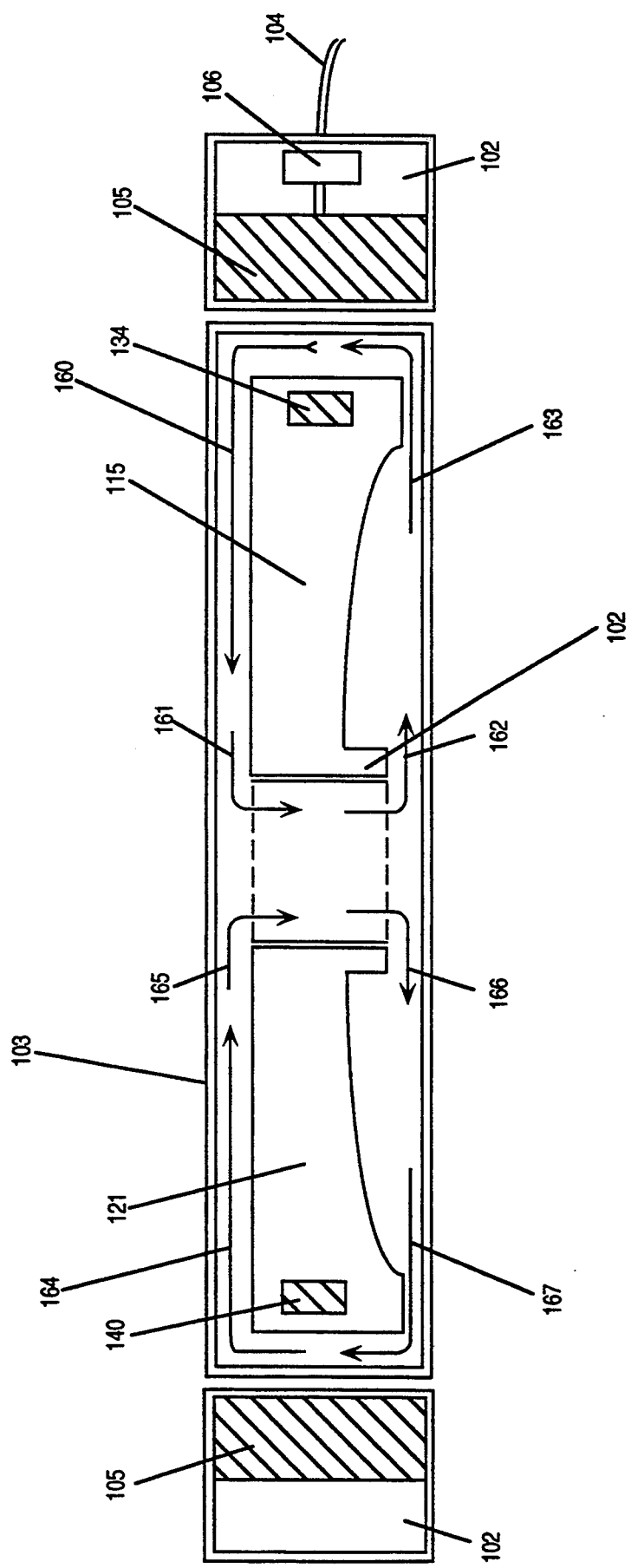
FIG. 5 is a view of a pattern of micromachine grooves etched into the bottom surface of the heat dissipation device.

FIG. 5 illustrates a cross sectional view of the heat transfer apparatus shown in FIGS. 1-4 along axis A—A of FIG. 2. It can be seen that the cable 104 directly contacts the processing circuit 106 which is electrically coupled to magnetic coil 105 of the magnetic coil assembly 102. Magnetic element 140 is attached to rotor blade 121. Similarly, magnetic element 134 is attached to rotor blade 115. Magnetic elements 140 and 134 are positioned relative to magnetic coil 105 so as to allow the magnetic field generated by magnetic coil 105 to act on magnetic elements 140 and 134. The magnetic elements may be affixed to the centrifugal rotor in any number of ways. However, it is preferred to encapsulate the magnets within the rotor blades. This may be done during the process of molding the centrifugal rotor 107.

Rotor blades 121 and 115 are shaped to allow for the circulation of heat transfer liquid around the moving rotor blades, and any number of different shapes and/or sizes of rotor blades may be used. However, it is preferable that the rotor blades have a shape that allows the heat transfer fluid to pass by in order to facilitate the movement of the centrifugal rotor upon initiation of the magnetic field.

The preferred flow pattern of the heat transfer liquid within the heat pipe 103 is illustrated by flow direction indicators 160-167. This flow pattern is initiated upon the movement of the centrifugal rotor 107. Thus, the fluid flows over the rotor blade as shown by flow indicator 160 and then through opening shown by flow indicator 161. The fluid then flows out of the center portion of the centrifugal rotor assembly 107, as shown by flow indicator 162. The fluid :flow continues as shown by flow indicator 163 around the outer perimeter of the heat pipe 103. The flow along the opposite side of the heat pipe 103 is indicated by flow indicators 164-167 and is identical to the flow shown by flow indicator arrow 160-163.

Figure 6:
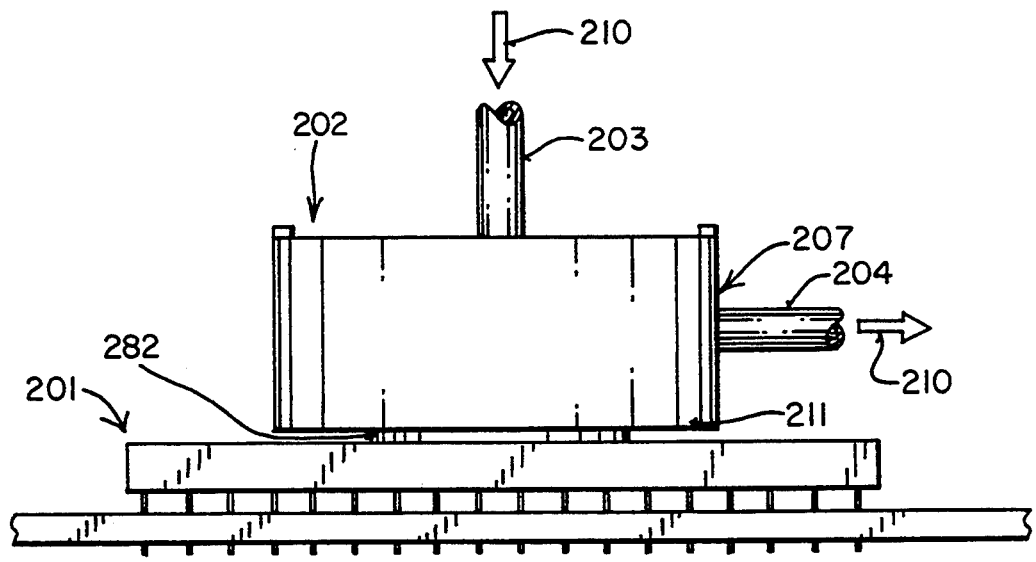
FIG. 6 is a side view of heat absorption chamber that is one aspect of a second embodiment of the present invention.

FIG. 6 illustrates a second alternative embodiment of the present invention in which a heat absorption chamber 202 is placed on IC package 201. As can be seen, the heat absorption chamber 202 is in direct contact with the heat spreader 282 of the IC package 201. Alternatively, the heat transfer apparatus of the first embodiment, as shown in FIGS. 1-5, can be interposed between the heat absorption chamber 202 and the IC package 201. The heat absorption chamber 202 is a preferably filled with heat transfer liquid. However, unlike the heat pipe of the first embodiment, the heat absorption chamber is not sealed, and the heat transfer liquid is carried away from the chamber for cooling. Transport of the heat transfer liquid is accomplished through the use of a pump (not shown), and cooling of the liquid is done by a heat exchanger (not shown). Thus, the heat absorption fluid is circulated outside of the chamber as well as inside the chamber. Circulating heat transfer liquid is introduced into the heat absorption chamber 202 via inlet 203 and leaves the heat absorption chamber via outlet 204. The chamber is preferably made from copper and is completely filled with heat transfer liquid. The heat transfer liquid is preferably a mixture of 50% water and 50% ethanol.

Figure 7:
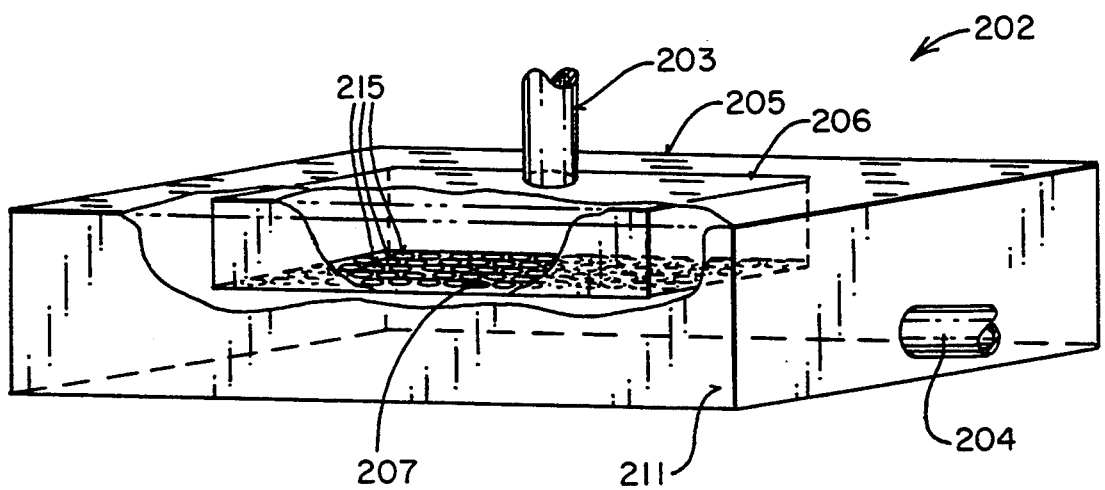
FIG. 7 is a cross-sectional perspective view of the heat absorption chamber of the second embodiment.

FIG. 7 is a perspective view of the heat absorption chamber 202. It can be seen that the heat absorption chamber has an outer frame 205 and an inner frame 206. A bottom heat conducting plate 211 is placed at the bottom of the outer frame 205, forming an outer chamber of the heat absorption chamber 202. The bottom heat conducting plate 211 is preferably in direct contact with the heat source (not shown) and transfers heat generated by the heat source into the heat absorption chamber 202.

A perforated plate 207 is disposed at the bottom of the inner frame 206 forming an inner chamber such that there is a gap between the walls of the inner chamber and the walls of the heat absorption chamber 202. Further, there is a gap between the perforated plate 207 and the bottom heat conducting plate 211. The walls of the inner frame 206 and the perforated plate 207 are preferably manufactured of plastic or some other insulating material. Holes 215 are made in the perforated plate 207 such that cooled heat absorption fluid that is deposited on the perforated plate from the inlet 203 flows over the perforated plate 207 and through the holes 215.

The walls of the inner chamber 206 are preferably solid. Thus, heat transfer liquid entering the heat absorption chamber 202 via the inlet 203 is forced to enter the outer chamber 205 via the holes 215 of the perforated plate 207. In this manner, the heat transfer liquid flows uniformly onto the inner surface of the heat conducting plate 211. Further, the heat transfer liquid impinges on the heat conducting plate 211 in a direction substantially normal to the surface of the heat conducting plate 211, maximizing thermal agitation. The combination of uniform flow and maximized thermal agitation combine to provide improved isothermal behavior and better control of boiling in the heat absorption chamber.

Figure 8:
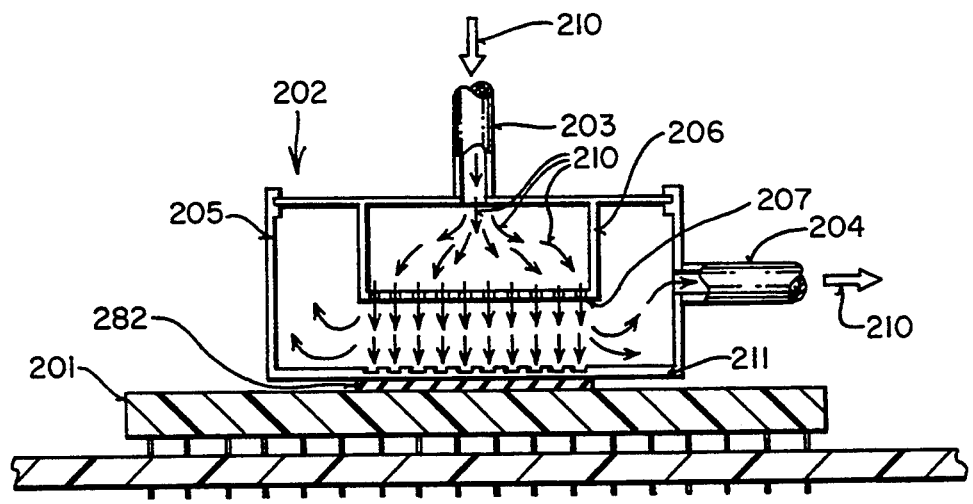
FIG. 8 is a cross-sectional side view of the heat absorption chamber of the second embodiment that illustrates the flow of the heat transfer liquid.

Reference is now made to FIG. 8, which is a cross-sectional view of the heat absorption chamber shown in FIGS. 6 and 7. The heat transfer liquid enters the heat absorption chamber 202 via the inlet as shown by flow arrows 210. The heat transfer liquid flows over the perforated plate 207 and through the holes in the perforated plate 207 such that the liquid impinges on the heat conducting plate 211 substantially normal to the surface of the heat conducting plate 211. As can be seen, the width of the heat perforated plate 207 is approximately that of the heat spreader 282, which is an integral part of the IC package 201. If there is no heat spreader, the width of the perforated plate 207 is preferably equal to the width of the entire IC package 201. This is because, in the absence of a heat spreader, the entire top surface of the IC package 201 is operating to transfer heat from the die.

The heat conducting plate 211 preferably includes micromachine grooves that are shown as notches formed in the heat conductive plate 211. Micromachine grooves increase the surface area of the bottom heat conducting plate 211 and produce a corresponding increase in the efficiency of heat transfer from the heat conducting plate 211 to the heat transfer liquid. The direction of liquid flow is indicated by flow indicators 210. The flow indicators 210 show possible liquid flow paths from the inlet 203 through the inner chamber and through openings 215 in the perforated plate 207. The fluid then flows over the bottom heat conductive plate 211 and out of the heat absorption chamber through the outlet 204.

Figure 9:
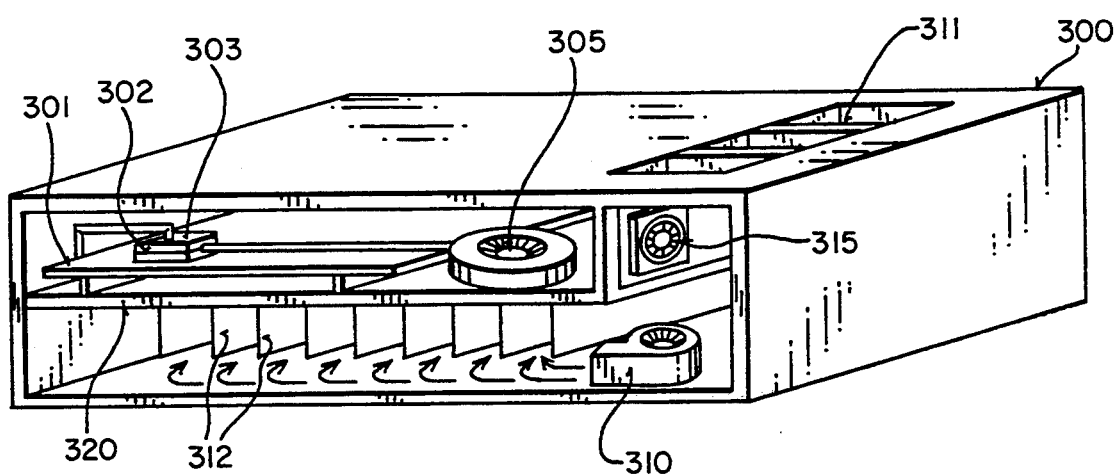
FIG. 9 is a cross-sectional perspective view of a first illustrative implementation of the heat transfer system of the second embodiment.

FIG. 9 shows the heat transfer system of the second embodiment in an illustrative implementation. The heat source 302 is shown coupled to circuit board 301, which is attached to the computer enclosure 300. Heat is transferred from the heat generating device 302 to the heat absorption chamber 303, where the heat is transferred to the heat transfer liquid. The heated heat transfer liquid is circulated through the heat absorption chamber 303 and out the outlet 304. The fluid is pumped by a magnetically coupled pump 305, which is preferably coupled to the heat exchanger 320. The liquid is cooled by the transfer of heat from heat exchanger 320 to the heat exchanger fins 312. Cool air flowing from air inlet 311 and propelled by fan 310 flows over the heat exchanger fins 312 so as to cool the fins. The air then exits the computer enclosure through an air outlet (not shown) in the back of the computer enclosure 300. The cooled heat transfer liquid then flows through inlet 309 and back into heat absorption chamber 303 for cooling the heat generating device. A second fan 315 may be used to move air across the components to provide additional cooling. Alternatively, the fan 310 can be positioned to move air across the components and the heat exchanger fins simultaneously.

Figure 10:
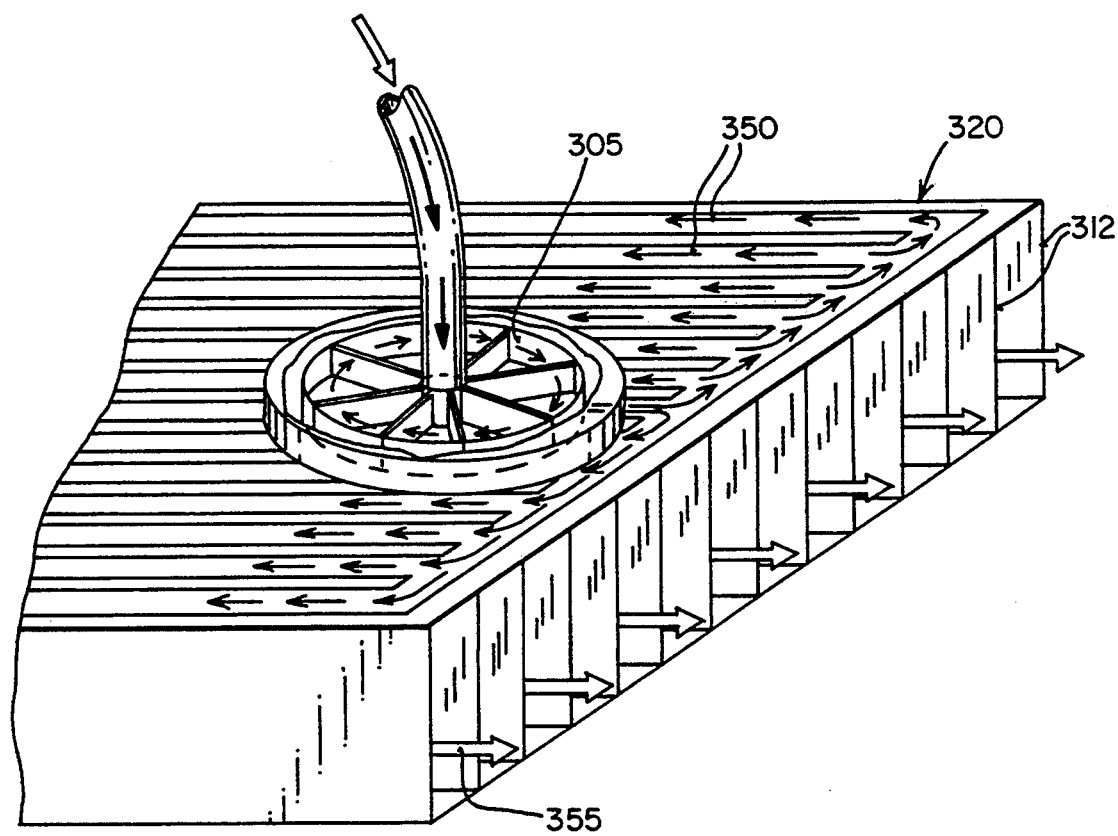
FIG. 10 is a cross-sectional perspective view of the first illustrative implementation that illustrates the configuration of the pump and the heat exchangers.

FIG. 10 illustrates the configuration of the pump with the heat exchanger. Pump 305 can be any of a number of known prior art pumps. However, a magnetically coupled pump is preferred because such pumps contain few components, are reliable and have a long life expectancy. The heated liquid enters the pump and is delivered to the heat exchanger 320. As may be seen, the heat exchanger 320 includes a top plate 307 and a bottom plate 308, which is coupled to the heat exchanger fins 312. Both plates are preferably manufacture of heat conducting materials. In the bottom plate 308 there are formed channels that allow for the circulation of the heat transfer liquid. The grooves are preferably aligned with the heat exchanger fins 312. Liquid flow arrows 350 and air flow arrows 355 indicate that the flow of the liquid is preferably counter to the flow of the air to maximize heat transfer.

Figure 11:
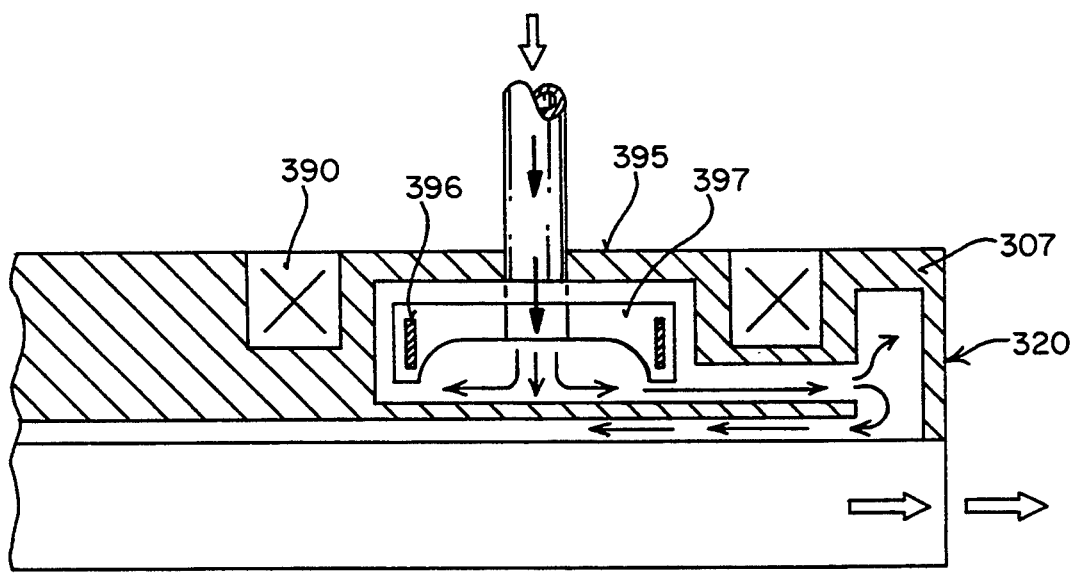
FIG. 11 is a cross-sectional side view of the pump and heat exchanger shown in FIG. 10.

FIG. 11 is a cross-sectional side view of the heat exchanger and the pump. The magnetic coil assembly 390 surrounds the pump 305. Disposed in the pump 305 is a rotor assembly 395 having fixed magnets 396 attached to the rotor blades 397. The magnetic coil assembly 390 generates a magnetic field when power is supplied. This magnetic field reacts with the fixed magnets, causing the rotor assembly 395 to rotate. This results in a pumping action. The liquid flow arrows 350 illustrate the flow of the heat transfer liquid into the heat exchanger 320.

Figure 12:
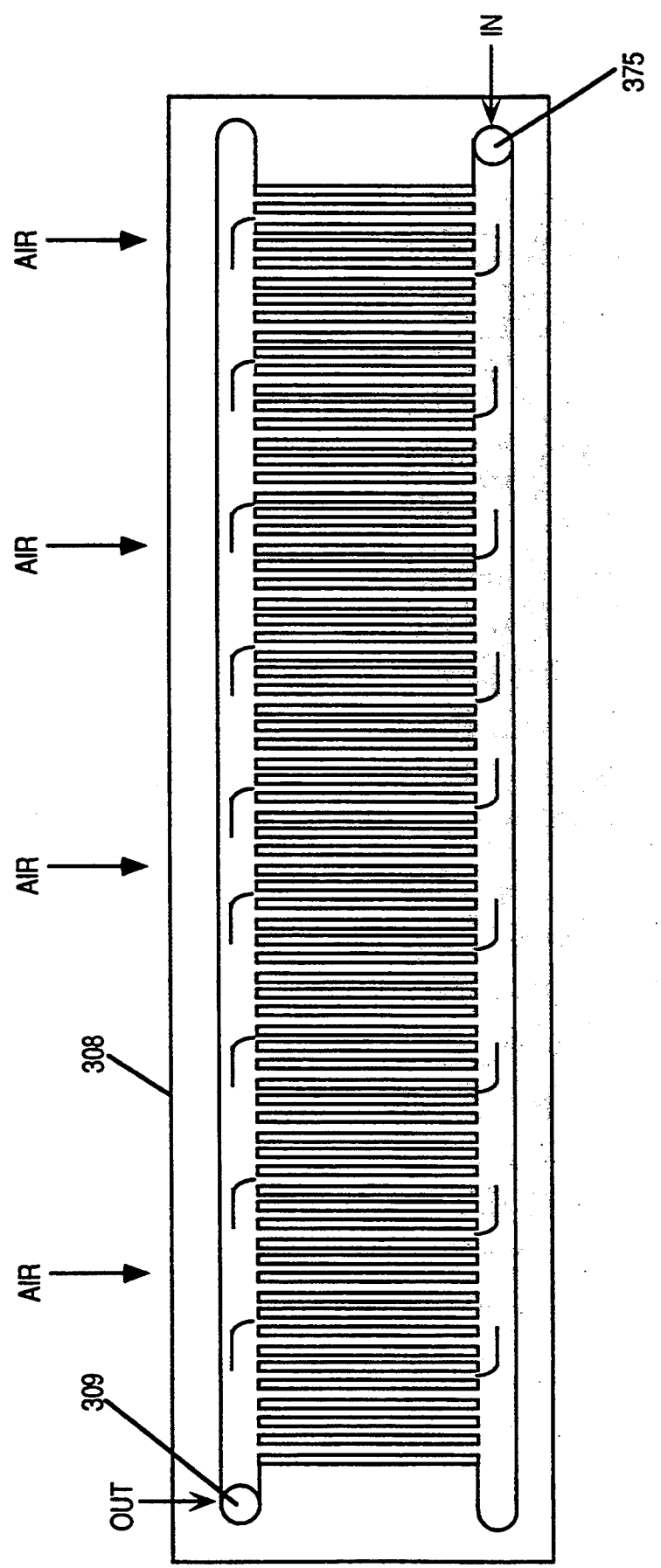
FIG. 12 is a top view of the bottom plate of the heat exchanger of the first implementation.

FIG. 12 illustrates the heat exchanger bottom plate 308 having channels formed within the plate. These channels allow for the flow of the heat transfer liquid from the inlet 375 and through the groove pattern to outlet 309. The cooled heat transfer liquid exits the heat exchanger 320 and is delivered to the heat absorption chamber. The heat transfer system of FIGS. 9-11 can be altered to refrigerate the heat source to a temperature below the ambient air temperature. This is useful because operating temperatures of 0° C. improve the performance of some ICs. The alteration is simple, requiring the pump to include a refrigeration unit and the heat transfer liquid to be a cryogenic refrigerant such as freon.

Figure 13:
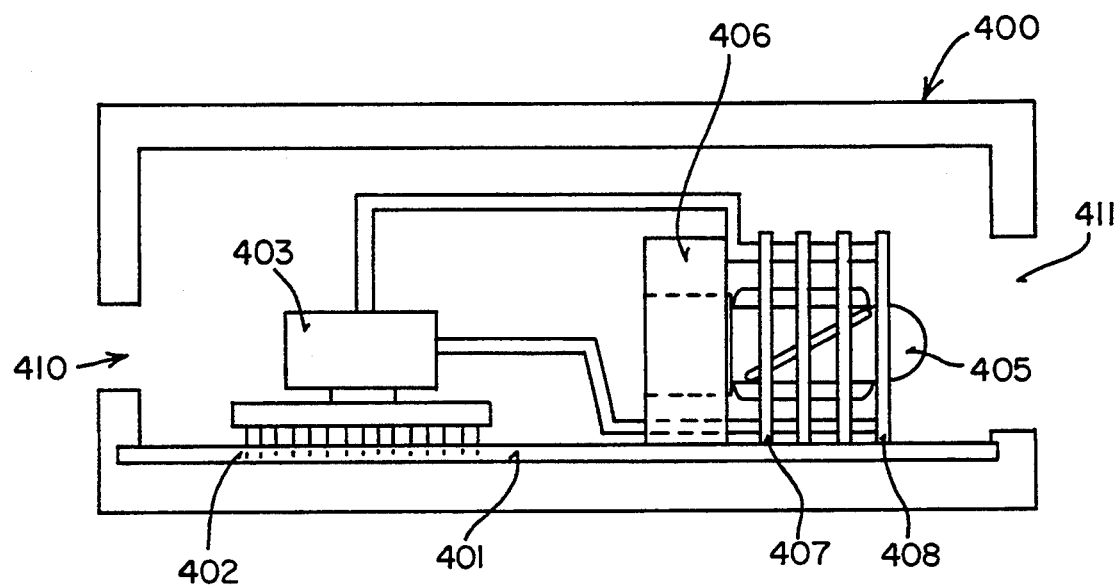
FIG. 13 is a side view of a second implementation of the second embodiment in which the heat exchanger is a ring-type heat exchanger.

FIG. 13 shows a second implementation of the second embodiment wherein a ring-type heat exchanger is used in conjunction with a magnetically coupled pump driven by a lemont fan to cool the heat transfer liquid. The heat absorption chamber 403 is connected to the heat source 402, which can be an IC package that is connected to circuit board 401. The computer enclosure 400 includes air inlet 410 and air outlet 411 for circulation of air within the computer enclosure 400. The ring-type heat exchanger includes a magnetically driven rotor assembly 470 disposed in a first cooling ring 406. A fan 405 is positioned in the center of the cooling rings such that it is axially aligned with the cooling rings 406–408. Fixed magnets are coupled to the back end of the rotor of fan 405. When the fan 405 rotates, the rotor assembly 470 rotates, causing a pumping action for circulating the heat transfer liquid.

The cooling rings 406–408 are hollow and manufactured of thin plates of high heat conducting material, such as copper. Upon engagement of the fan 405, the heat transfer liquid is pumped from the outlet pipe 404 through cooling rings 406–408. As the heat transfer liquid flows through the cooling rings, heat is transferred to the cooling rings. The air driven by the fan flows over the cooling rings, transporting the heat away. The heat transfer liquid flows out of the ring-type heat exchanger into the fluid conducting pipe 409. The cooled fluid is then recirculated through the heat absorption chamber 403.

Figure 14:
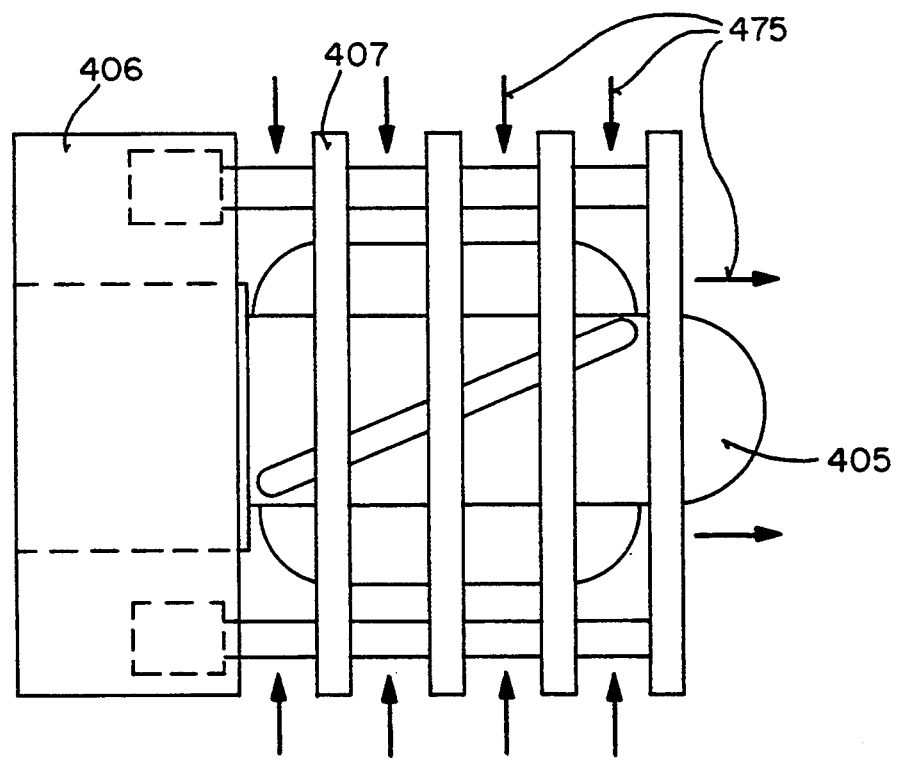
FIG. 14 is a side view of the ring-type heat exchanger.
Figure 15:
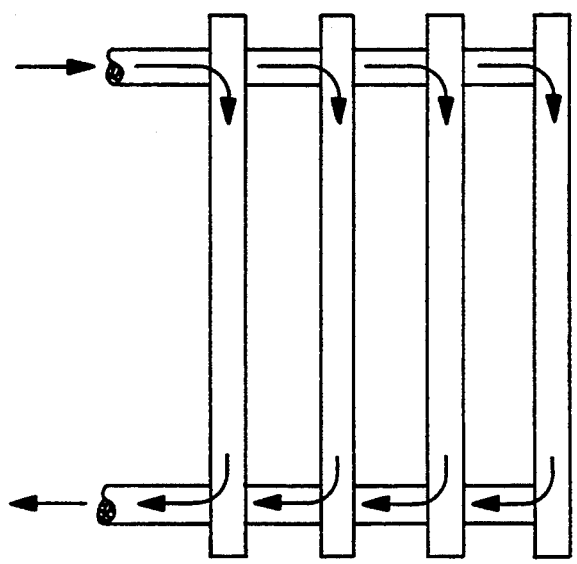
FIG. 15 is a side view of the ring-type heat exchanger illustrating fluid flow.
Figure 16:
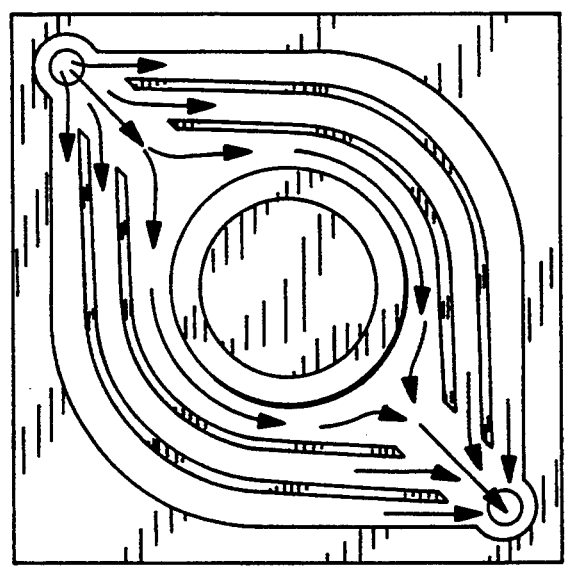
FIG. 16 is a top view of a heat exchanger ring.
Figure 17:
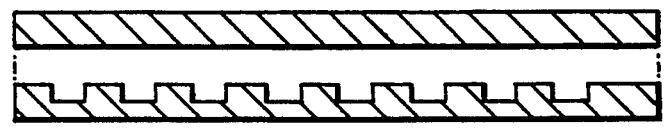
FIG. 17 is a cross-sectional side view of a heat exchanger ring.

FIG. 14 is a side view of the ring-type heat exchanger illustrating the fact that the air preferably flows across the faces of the cooling rings. FIG. 15 illustrates the flow of the heat transfer liquid through exemplary cooling rings. FIG. 16 is a top view of a cooling ring that illustrates the channels formed in the bottom plate of the cooling through which the heat transfer liquid flows. FIG. 17 is a side view of the same cooling ring illustrating the top and bottom plates of the cooling ring.

The heat transfer system of the second embodiment can be implemented in existing computer with a minimum increase in enclosure size and the acoustic signature of the computer system. This is because liquid cooling is more efficient than air cooling, which allows for a smaller volume in which to enclose the components, and because the use of the heat exchanger maximizes the heat transfer surface area presented to the cooling air, which allows for the use of a smaller fan. Although the heat transfer system has been diagramatically illustrated with a single heat absorption chamber, a plurality of heat absorption chambers can be implemented using a single pump and heat exchanger.

Thus, apparatus that provide sufficient cooling for high power ICs with a minimum impact on the goals of minimizing enclosure size and minimizing the acoustic signature of the system have been described. The described embodiments are primarily illustrative of the many different configurations of the present invention which are possible. Therefore, it is to be understood that the particular embodiment shown and described by way of illustration are no way intended to be considered limiting.

What is claimed is:

1. A heat transfer apparatus, comprising:
   a heat pipe containing a heat transfer liquid;
   a magnetic coil surrounding the heat pipe, the magnetic coil for producing a magnetic field when an electric current is supplied to the magnetic coil, the magnetic field passing through the heat pipe; and
   an agitator disposed in the heat pipe, the agitator for agitating the heat transfer liquid in response to the magnetic field.

2. The heat transfer apparatus of claim 1, wherein the agitator is a rotor assembly, the rotor assembly including a plurality of rotor blades, a magnet being coupled to at least one rotor blade.

3. The heat transfer apparatus of claim 2, the heat transfer device further comprising:
   a circuit coupled to the magnetic coil, the circuit for providing the electric current.

4. The heat transfer apparatus of claim 3, wherein the circuit is computer controlled.

5. The heat transfer apparatus of claim 4 wherein there are from 12 to 14 rotor blades.

6. The heat transfer apparatus of claim 5 wherein the heat transfer liquid fills from 50% to 95% of the heat pipe.

7. A computer system comprising:
   an integrated circuit, the integrated circuit capable of generating heat during operation;
   a heat transfer apparatus coupled to the integrated circuit for transferring heat away from the integrated circuit, the heat transfer apparatus including:
   a heat pipe containing a heat transfer liquid;
   a magnetic coil surrounding the heat pipe, the magnetic coil for producing a magnetic field when an electric current is supplied to the magnetic coil, the magnetic field passing through the heat pipe; and
   an agitator disposed in the heat pipe, the agitator for agitating the heat transfer liquid in response to the magnetic field.

8. The computer system of claim 7, wherein the agitator is a rotor assembly, the rotor assembly including a plurality of rotor blades, a fixed magnet being coupled to at least one rotor blade.

9. The computer system of claim 8, the heat transfer device further comprising:
   a circuit coupled to the magnetic coil, the circuit for providing the electric current.

10. The computer system of claim 7, wherein the integrated circuit is a processor.

* * * * *